(12) United States Patent
Khorram

(10) Patent No.: US 6,970,689 B2
(45) Date of Patent: Nov. 29, 2005

(54) PROGRAMMABLE MIXER FOR REDUCING LOCAL OSCILLATOR FEEDTHROUGH AND RADIO APPLICATIONS THEREOF

(75) Inventor: Shahla Khorram, Los Angeles, CA (US)

(73) Assignee: Broadcom Corporation, Irvine, CA (US)

( * ) Notice: Subject to any disclaimer, the term of this patent is extended or adjusted under 35 U.S.C. 154(b) by 462 days.

(21) Appl. No.: 10/115,531

(22) Filed: Apr. 3, 2002

(65) Prior Publication Data

US 2003/0157902 A1 Aug. 21, 2003

Related U.S. Application Data

(63) Continuation-in-part of application No. 10/077,571, filed on Feb. 15, 2002, now Pat. No. 6,801,761.

(51) Int. Cl.[7] .......................... H03C 1/62; H04B 17/00; H04B 1/04; H04B 1/10; H04B 15/06
(52) U.S. Cl. ................. 455/326; 455/118; 455/126; 455/310; 455/317; 455/115.1; 455/313; 455/323; 327/113
(58) Field of Search ............................ 455/114.1, 115.1, 455/115.2, 115.3, 126, 326, 313, 323, 118, 455/317, 310; 327/113, 116, 355

(56) References Cited

U.S. PATENT DOCUMENTS

| | | | | |
|---|---|---|---|---|
| 5,001,773 A | * | 3/1991 | White | 455/118 |
| 5,471,665 A | * | 11/1995 | Pace et al. | 455/343.2 |
| 5,652,547 A | * | 7/1997 | Mokhtar et al. | 330/279 |
| 5,793,817 A | * | 8/1998 | Wilson | 375/297 |
| 5,862,466 A | * | 1/1999 | Erickson | 455/321 |
| 6,058,291 A | * | 5/2000 | Ketcham | 455/46 |
| 6,535,725 B2 | * | 3/2003 | Hatcher et al. | 455/317 |
| 6,567,649 B2 | * | 5/2003 | Souissi | 455/83 |
| 6,594,504 B1 | * | 7/2003 | Grasset | 455/550.1 |
| 6,711,396 B1 | * | 3/2004 | Bergsma et al. | 455/317 |
| 6,763,227 B2 | * | 7/2004 | Kramer | 455/115.1 |
| 6,801,761 B2 | * | 10/2004 | Khorram | 455/326 |
| 6,868,128 B1 | * | 3/2005 | Lane | 375/319 |
| 2001/0053671 A1 | * | 12/2001 | Friedlander et al. | 455/78 |
| 2003/0194976 A1 | * | 10/2003 | Bhatti | 455/91 |

\* cited by examiner

*Primary Examiner*—Nick Corsaro
*Assistant Examiner*—Raymond B. Persino
(74) *Attorney, Agent, or Firm*—Gary W. Hamilton; Bruce Garlick; Garlick, Harrison & Markison

(57) ABSTRACT

A state of a programmable mixer is set during a calibration phase to minimize local oscillator feedthrough. During a calibration phase, inputs to the programmable mixer are set to zero, or to a known state and the local oscillator is set to a calibration frequency. Then, one of a plurality of known calibration states of the programmable mixer is entered and the local oscillator feedthrough is measured. For each of a plurality of operating states an amplified output of the programmable mixer is measured. In one operation, the state of the programmable mixer in which the programmable mixer operates during a next operation phase is the state that produces minimal local oscillator feedthrough. In another operation, operation continues until a state is found that produces a local oscillation feedthrough that meets an operating criteria and that state is used during the next operation phase. After these operations are complete, programmable mixer calibration operations are completed until the next calibration phase commences.

6 Claims, 14 Drawing Sheets

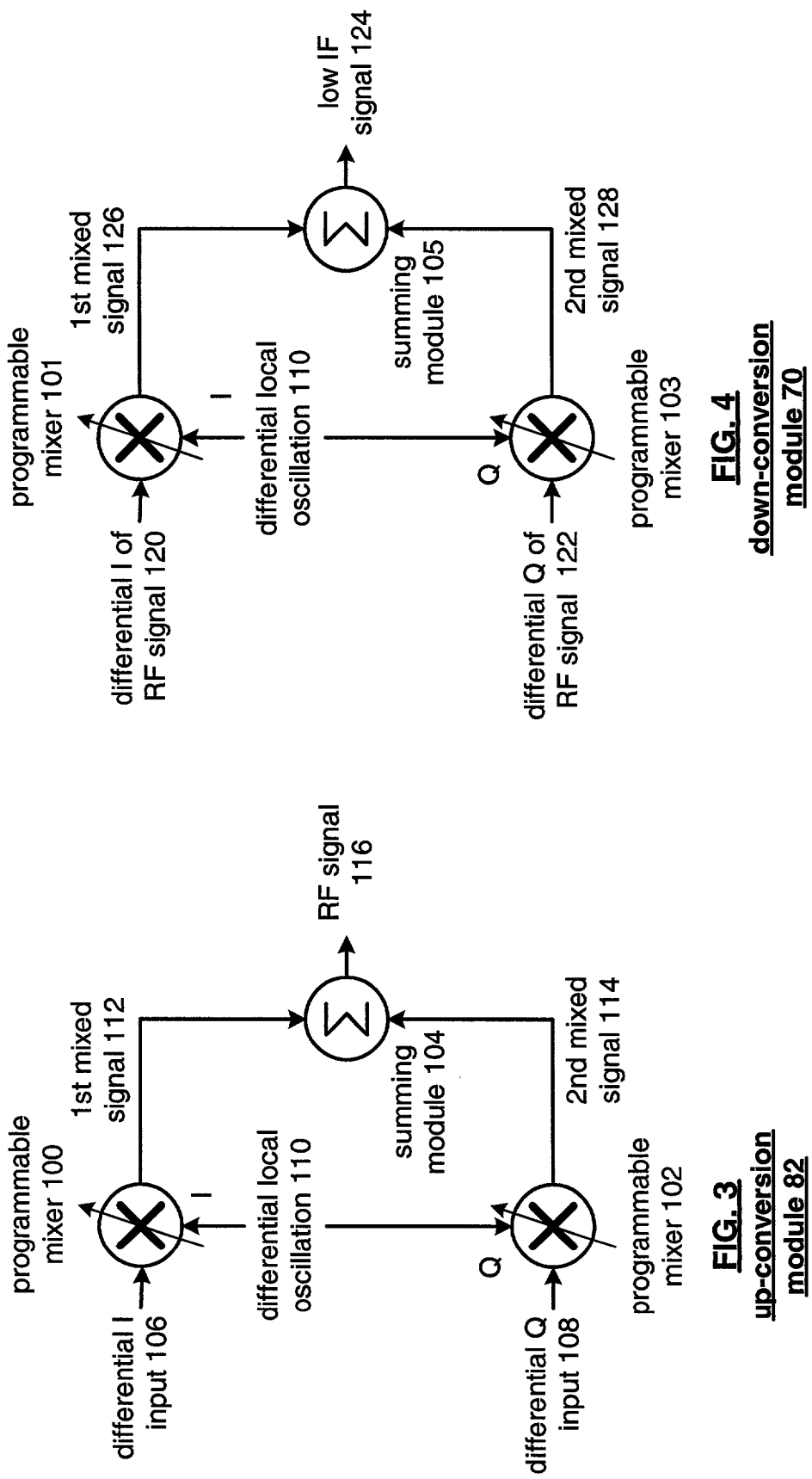
FIG. 4 down-conversion module 70
FIG. 3 up-conversion module 82 programmable mixer 100 or 102

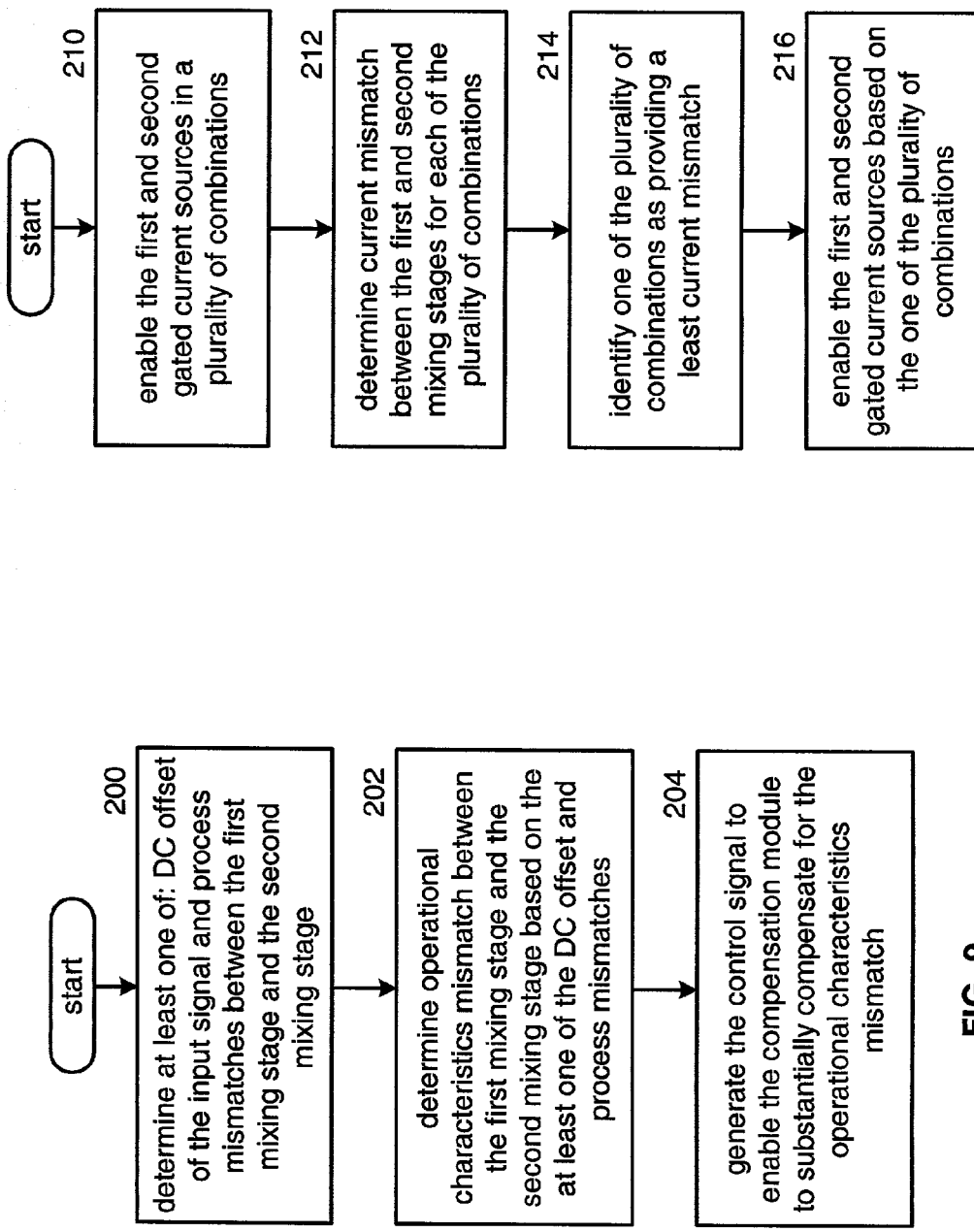

PROGRAMMABLE MIXER FOR REDUCING LOCAL OSCILLATOR FEEDTHROUGH AND RADIO APPLICATIONS THEREOF

CROSS REFERENCE TO RELATED APPLICATION

This application is a continuation-in-part of U.S. Regular application Ser. No. 10/077,571, filed Feb. 15, 2002 now U.S. Pat. No. 6,801,761, which is incorporated herein by reference in its entirety.

FIELD OF THE INVENTION

This invention relates generally to communication systems and more particularly to radio transceivers used within such communication systems.

BACKGROUND OF THE INVENTION

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), wireless application protocols (WAP), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel (e.g., one of the plurality of radio frequency (RF) carriers of the wireless communication system) and share information over that channel. For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver receives RF signals, removes the RF carrier frequency from the RF signals via one or more intermediate frequency stages, and demodulates the signals in accordance with a particular wireless communication standard to recapture the transmitted data. The transmitter converts data into RF signals by modulating the data in accordance with the particular wireless communication standard and adds an RF carrier to the modulated data in one or more intermediate frequency stages to produce the RF signals.

As the demand for enhanced performance (e.g., reduced interference and/or noise, improved quality of service, compliance with multiple standards, increased broadband applications, et cetera), smaller sizes, lower power consumption, and reduced costs increases, wireless communication device engineers are faced with a very difficult design challenge to develop such a wireless communication device. Typically, an engineer is forced to compromise one or more of these demands to adequately meet the others. For instance, an engineer may choose a direct conversion topology (i.e., convert directly from an RF signal to a base-band signal or directly from a base-band signal to an RF signal) to meet size requirements and/or broadband application requirements. However, for direct conversion transceivers, noise and/or interference increases due to local oscillation leakage, non-linearities due to component mismatches and/or process variations are more detrimental to overall performance, and DC offsets, which result from a slight offset between the transmitting frequency of one wireless communication device and the frequency of the receiver in another wireless communication device, are more pronounced.

As is known, local oscillation leakage results from imperfections of the mixers within a transmitter that allow the local oscillation, which equals the RF, to be present in the resultant RF signal. Common causes of this local oscillation leakage (or local oscillation feedthrough) are the presence of DC in an information signal provided to the mixer, the presence of DC in the local oscillator signal, and mismatches in the mixer. The local oscillation leakage can be minimized by using multiple IF stages within the transmitter. In such an implementation, each IF stage uses a local oscillation that has a significantly different frequency than the RF, where the sum of the multiple local oscillations equals the RF. Since each local oscillation has a significantly different frequency than the RF, each local oscillation is outside the RF band of interest (i.e., the frequency spectrum of the resulting RF signal). But this requires an abandoning of the direct conversion topology and its benefits with respect to size reduction, power consumption reduction, reduced costs, and reduced complexity for broadband applications. Presence of local oscillator leakage in the RF signal reduces the signal to noise ratio of the signal and will cause loss of data.

Costs of manufacturing a radio frequency integrated circuit (IC) may be reduced by switching from one integrated circuit manufacturing process to another. For example, a CMOS process may be used instead of a bi-CMOS process since it is a more cost effective method of IC manufacture, but the CMOS process increases component mismatches, increases temperature related variations, and increases process variations. As such, noise, local oscillator leakage, non-linearities and other factors that negatively impact an RF IC performance are increased for a CMOS process. Thus, in many RF IC applications, a designer chooses between cost savings and performance.

As is further known, many wireless communication standards provide for varying the transmitting power of the transmitter based on received signal strength of the wireless communication device receiving the transmission to conserve power. For instance, if the received RF signal is very strong, the receiver can easily recapture the embedded data.

In such an instance, the transmission power level of the transmitter can be reduced and still provide a sufficiently strong RF signal to enable the receiver accurately recover the embedded data. Conversely, when the received signal is too weak, the receiver cannot accurately recover the embedded data, thus the transmission power level needs to be increased. Typically, increasing the gain of its power amplifier increases transmitter power. Changing the bias level of the input signal increases the gain of the power amplifier. While this increases the gain, the linearity of the power amplifier is adversely affected, which adversely affects the performance of the transmitter and the overall radio.

Therefore, a need exists for a low power, reduced size, reduced cost, and enhanced performance radio, radio transmitter, radio receiver, and/or components thereof.

SUMMARY OF THE INVENTION

The programmable mixer disclosed herein substantially meets these needs and others. A programmable mixer includes a $1^{st}$ mixing stage, a $2^{nd}$ mixing stage, a coupling element, and a compensation module. The $1^{st}$ mixing stage is operably coupled to mix one leg of a differential input signal with a differential local oscillation. The $2^{nd}$ mixing stage is operably coupled to mix the other leg of the differential input with the differential local oscillation. The coupling element, which may be a resistor, inductor, MOSFET, or other such components, couples the $1^{st}$ and $2^{nd}$ mixing stages together.

The compensation module is operably coupled to the $1^{st}$ mixing stage and/or the $2^{nd}$ mixing stage to modify the operational characteristics (e.g., current, impedance, gain, et cetera) of the $1^{st}$ and/or $2^{nd}$ mixing stages based on a control signal. By adjusting the operational characteristics of the $1^{st}$ and/or $2^{nd}$ mixing stages, the compensation module is attempting to more closely match the operational characteristics of the $1^{st}$ mixing stage with those of the $2^{nd}$ mixing stage. For example, the compensation module may adjust current flow in the $1^{st}$ and/or $2^{nd}$ mixing module such that the current flow through the $1^{st}$ mixing module closely matches the current flow through the $2^{nd}$ mixing module, which reduces imbalances and correspondingly reduces local oscillation leakage.

The programmable mixer may be used in an up-conversion module of the transmitter and/or in the down-conversion module of the receiver. Whether the programmable mixer is used in the transmitter path and/or receiver path, the compensation module may be constructed in a variety of embodiments. For instance, the compensation module may include single current source operably coupled to the $1^{st}$ mixing source and another current source coupled to the $2^{nd}$ mixing source to provide an offset current for the $1^{st}$ and $2^{nd}$ mixing stage. In an alternative embodiment, the compensation module may include a plurality of current sources to compensate the $1^{st}$ mixing stage and a $2^{nd}$ plurality of current sources to compensate the $2^{nd}$ mixing stage. Alternatively, the compensation module may include current sources that subtract current from the $1^{st}$ mixing stage and/or $2^{nd}$ mixing stage.

According to one aspect of the present invention, the programmable mixer is present in the transmit portion of an RF transceiver. With this RF transceiver, a state of the programmable mixer is set during a calibration phase to minimize local oscillator feedthrough. During this calibration phase, inputs to the programmable mixer are set to zero, or to a known state and the local oscillator is set to a calibration frequency. Then, one of a plurality of known calibration states of the programmable mixer is entered and the local oscillator feedthrough is measured. Because the value of the local oscillator feedthrough will be relatively small, a special power amplifier (coupled to the output of the programmable mixer) may be required. With this structure, the gain of the programmable amplifier is increased during the calibration stage to produce an amplified signal.

For each of a plurality of operating states of the programmable mixer, the amplified output of the mixer is measured. In one embodiment, the state of the programmable mixer in which the programmable mixer operates during a next operation phase is the state that produces minimal local oscillator feedthrough. In another operation, this operation continues until a state is found that produces a local oscillation feedthrough that meets an operating criteria and that state is used during the next operation phase. After these operations are complete, programmable mixer calibration operations are completed until the next calibration phase commences.

Thus, operation according to the present invention allows the programmable mixer to be calibrated to reduce or minimize local oscillator feedthrough. An RF signal produced by the programmable mixer during subsequent operations will therefore have a higher signal to noise ratio. Other features and advantages of the present invention will become apparent from the following detailed description of the invention made with reference to the accompanying drawings.

BRIEF DESCRIPTION OF THE DRAWINGS

FIG. 3 illustrates a schematic block diagram of an up-conversion module in accordance with the present invention;

FIG. 4 illustrates a schematic block diagram of a down-conversion module in accordance with the present invention;

FIG. 9 illustrates a logic diagram of a method for determining the control signal that adjusts the compensation module in accordance with the present invention; and FIG. 10 illustrates a logic diagram of an alternate method for determining the control signal that adjusts the compensation module in accordance with the present invention.

DETAILED DESCRIPTION

Figure 1:
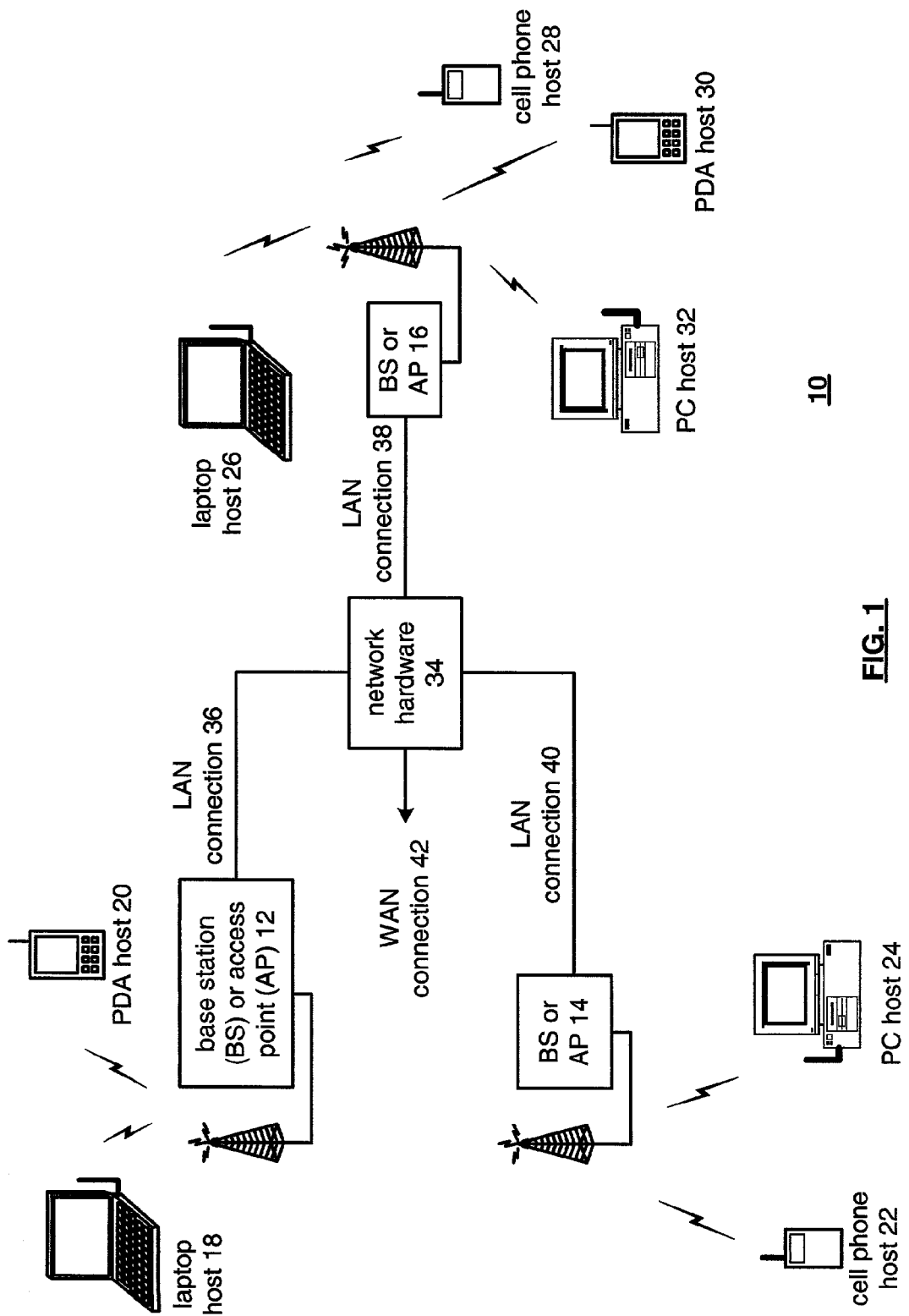
FIG. 1 illustrates a schematic block diagram of a wireless communication system that supports wireless communication devices in accordance with the present invention.

FIG. 1 illustrates a schematic block diagram of a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes an adjustable transmitter and/or receiver that include programmable mixers as disclosed herein to enhance performance, reduce costs, reduce size, and/or enhance broadband applications.

Figure 2:
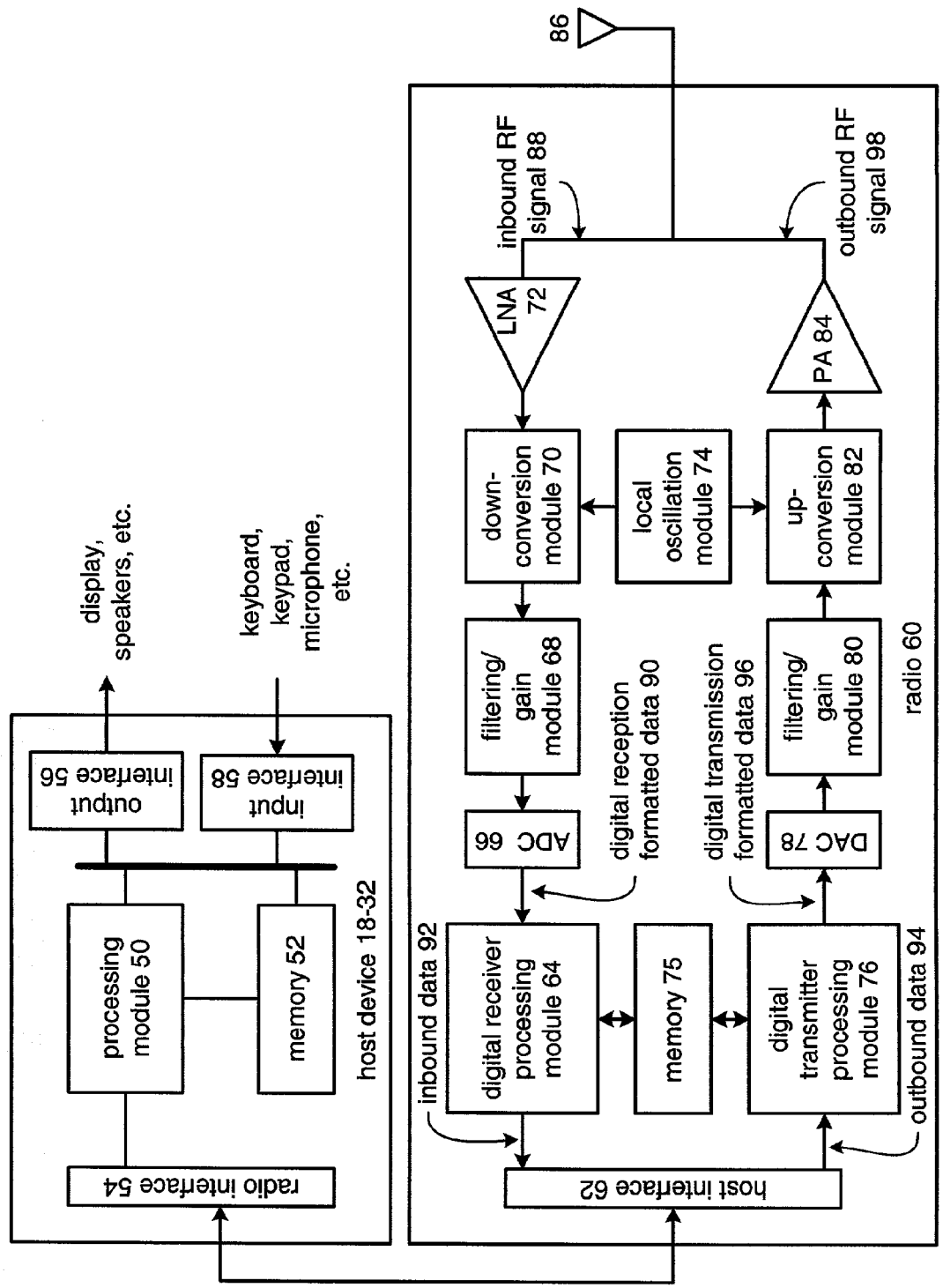
FIG. 2 illustrates a schematic block diagram of a wireless communication device in accordance with the present invention.

FIG. 2 illustrates a schematic block diagram of a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself For data received via the input interface 58, the processing module 50 may perform a corresponding host function on the data and/or route it to the radio 60 via the radio interface 54.

Radio 60 includes a host interface 62, digital receiver processing module 64, analog-to-digital converter 66, filtering/gain module 68, down conversion module 70, low noise amplifier 72, local oscillation module 74, memory 75, digital transmitter processing module 76, digital-to-analog converter 78, filtering/gain module 80, up-conversion module 82, power amplifier 84, and an antenna 86. The antenna 86 may be a single antenna that is shared by the transmit and receive paths or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 75 stores, and the processing module 64 and/or 76 executes, operational instructions corresponding to at least some of the functions illustrated in FIGS. 3–10.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE802.11a, IEEE802.11b, Bluetooth, et cetera) to produce digital transmission formatted data 96. The digital transmission formatted data 96 will be a digital base-band signal or a digital low IF signal, where the low IF will be in the frequency range of zero to a few megahertz.

The digital-to-analog converter 78 converts the digital transmission formatted data 96 from the digital domain to the analog domain. The filtering/gain module 80 filters and/or adjusts the gain of the analog signal prior to providing it to the up-conversion module 82. The up-conversion module 82, which may include programmable mixers as disclosed herein, directly converts the analog baseband or low IF signal into an RF signal based on a transmitter local oscillation provided by local oscillation module 74. The power amplifier 84 amplifies the RF signal to produce outbound RF signal 98. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the low noise amplifier 72, which amplifies the signal 88 to produce an amplified inbound RF signal. The low noise amplifier 72 provides the amplified inbound RF signal to the down conversion module 70, which may include programmable mixers as disclosed herein. The down conversion module 70 directly converts the amplified inbound RF signal into an inbound low IF signal based on a receiver local oscillation provided by local oscillation module 74. The down conversion module 70 provides the inbound low IF signal to the filtering/gain module 68, which filters and/or adjusts the gain of the signal before providing it to the analog to digital converter 66.

The analog-to-digital converter 66 converts the filtered inbound low IF signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54.

FIG. 3 illustrates a schematic block diagram of an up-conversion module 82 that may be used in the transmit path of a wireless communication device. The up-conversion module 82 includes a $1^{st}$ programmable mixer 100, a $2^{nd}$ programmable mixer 102 and a summing module 104. The $1^{st}$ programmable mixer 100 mixes a differential I input signal 106 with a differential local oscillation 110 to produce a $1^{st}$ mixed signal 112. The $2^{nd}$ programmable mixer 102 is operably coupled to mix a differential Q input signal 108 with the differential local oscillation 110 to produce a $2^{nd}$ mixed signal 114. The differential I and Q signals 106 and 108 correspond to the analog in-phase and quadrature components representation of the digital transmission formatted data 96 after processing by digital-to-analog converter 78 and the filtering/gain module 80.

The summing module 104 sums the $1^{st}$ mixed signal 112 with the $2^{nd}$ mixed signal 114 to produce an RF signal 116. The RF signal 116 is provided to power amplifier 84 to produce outbound RF signal 98. The programmable mixer 100 and 102 will be described in greater detail with reference to FIGS. 5–10.

FIG. 4 illustrates a schematic block diagram of the down-conversion module 70 that includes the programmable mixer 101, programmable mixer 103 and summing module 105. In this embodiment, the programmable mixer 101 mixes the differential I component of an RF signal 120 with the differential local oscillation 110 to produce a $1^{st}$ mixed signal 126. The $2^{nd}$ programmable mixer 103 mixes a differential Q component of the RF signal 120 with the differential local oscillation 110 to produce a $2^{nd}$ mixed signal 128.

The summing module 105 sums the $1^{st}$ mixed signal 126 with the $2^{nd}$ mixed signal 128 to produce a low IF signal 124. Note that the output of summing module 105 would be band-pass filtered or low-pass filtered to produce the low IF signal 124. In an alternate embodiment of down-conversion module 70, the summing module 105 would be omitted and the $1^{st}$ and $2^{nd}$ mixing signals 126 and 128 would be provided to a low pass or band pass filter which would produce the low IF signal 124. Optionally, the low pass or band pass filter may be contained in a coupled baseband processor.

Figure 5:
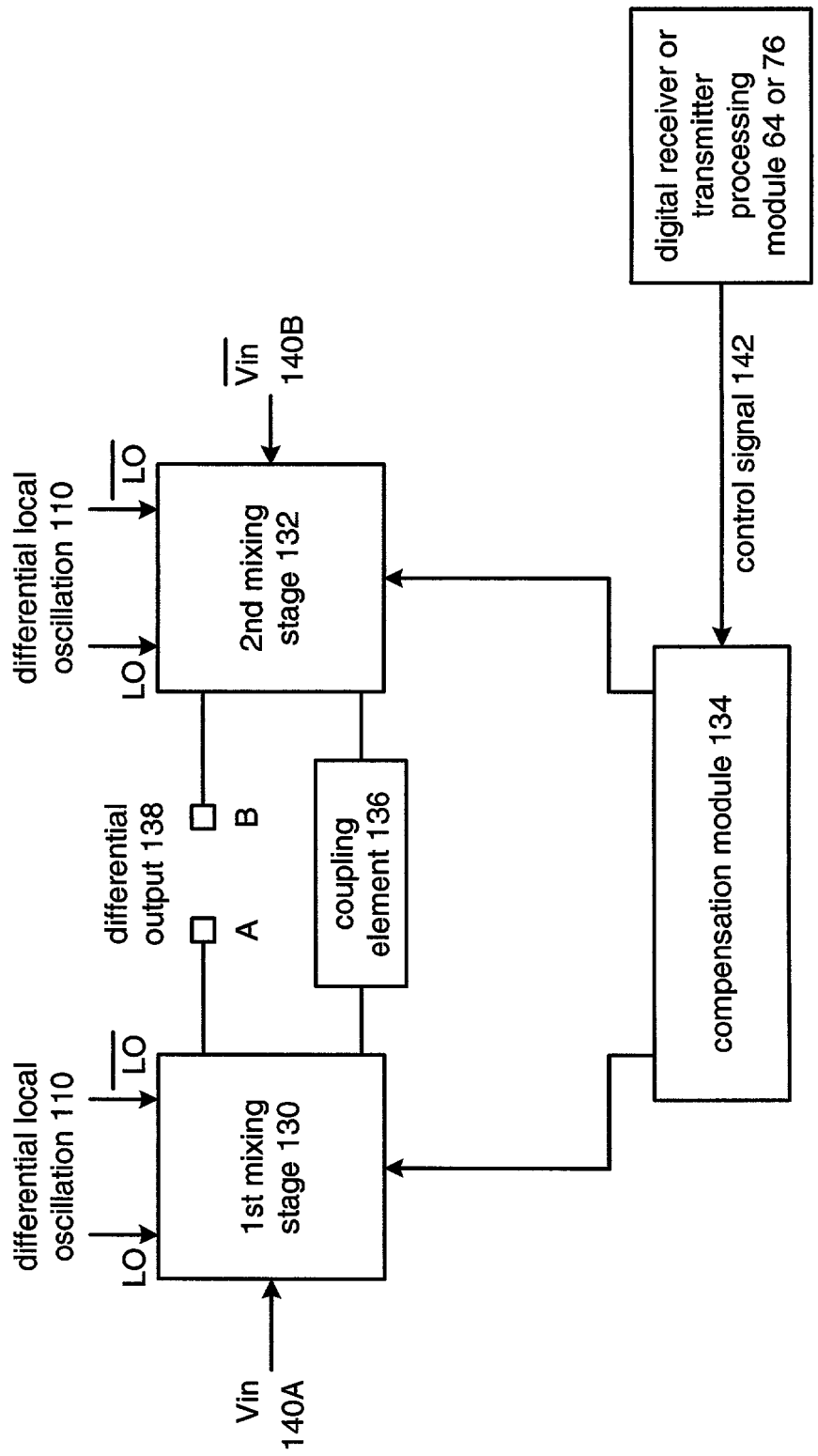
FIG. 5 illustrates a schematic block diagram of a programmable mixer in accordance with the present invention.

FIG. 5 illustrates a schematic block diagram of programmable mixer 100 or 102. The programmable mixer includes a $1^{st}$ mixing stage 130, a $2^{nd}$ mixing stage 132, compensation module 134 and coupling element 136. The $1^{st}$ mixing stage 130 is operably coupled to mix one leg of a differential input signal 140A (which may be one leg of the I or Q component of signals 106, 108, 112 or 122) with the differential local oscillation 110 (LO and LO-bar). The mixing performed by the $1^{st}$ mixing stage 130 may be altered based on compensation provided by compensation module 134.

The $2^{nd}$ mixing stage 132 is operably coupled to mix the other leg of a differential input 140B with the differential local oscillation 110. The mixing performed by the $2^{nd}$ mixing stage 132 may be altered by compensation module 134.

The $1^{st}$ and $2^{nd}$ mixing stages 130 and 132 are operably coupled together via coupling element 136, which may be a resistor and/or inductor. The $1^{st}$ mixing stage 130 as configured, produces a $1^{st}$ leg of differential output 138 and the $2^{nd}$ mixing stage 132 produces the other leg of differential output 138.

The compensation module 134 is operably coupled to receive a control signal 142 from the digital receiver and/or digital transmitter processing module 64 and/or 76. The compensation module 134, based on control signal 142, compensates the operational characteristics of the $1^{st}$ mixing stage 130 and/or the $2^{nd}$ mixing stage 132 such that the operational characteristics of the $1^{st}$ mixing stage 130 more closely matches the operational characteristics of the $2^{nd}$ mixing stage 132. For example, the compensation module 132 may affect the gain of the $1^{st}$ mixing stage and/or $2^{nd}$ mixing stage, the impedance of the $1^{st}$ mixing stage and/or $2^{nd}$ mixing stage, the current flowing through the $1^{st}$ mixing stage and/or $2^{nd}$ mixing stage, et cetera.

Figure 6:
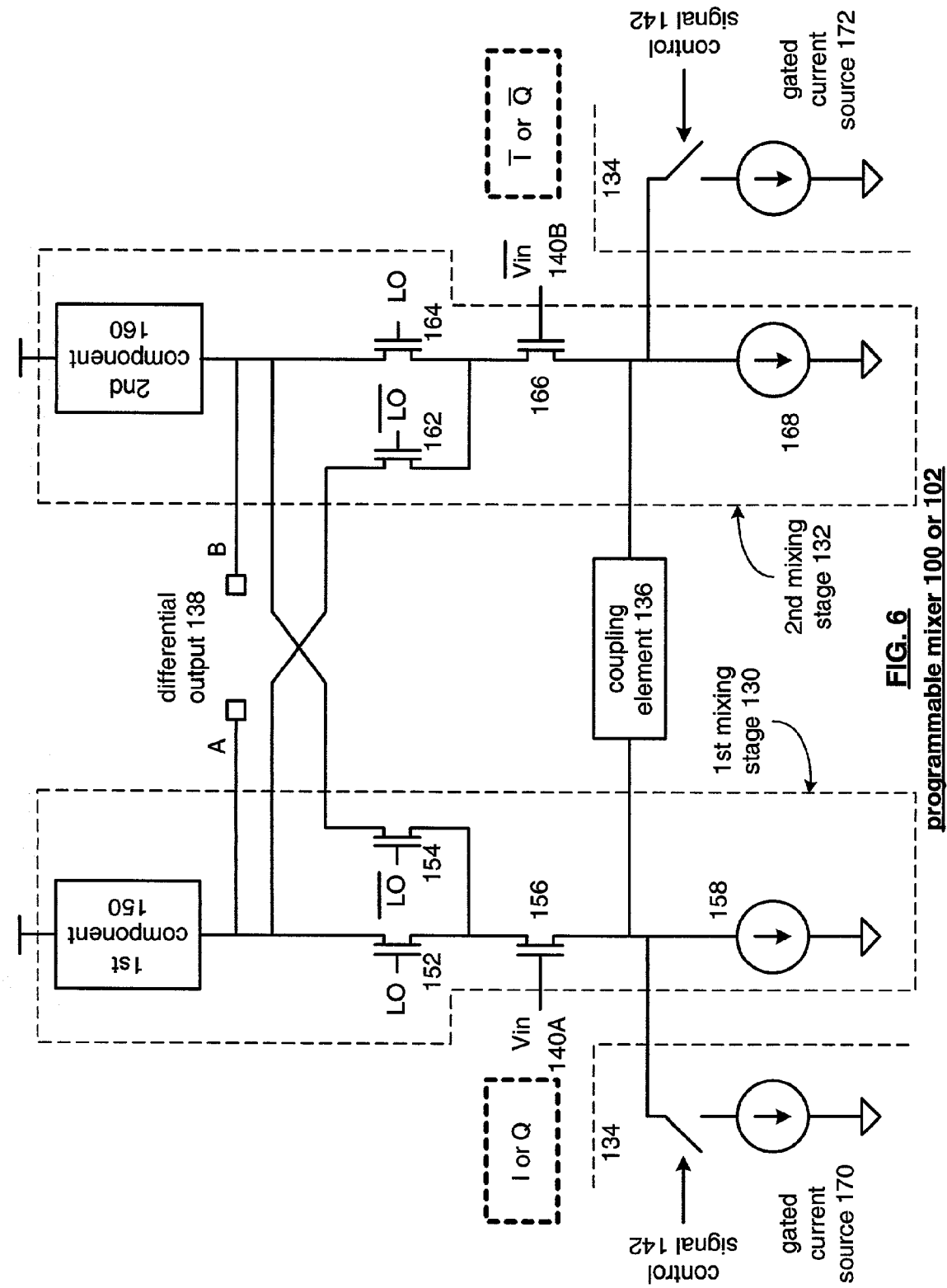
FIG. 6 illustrates a schematic block diagram of an alternate programmable mixer in accordance with the present invention.

FIG. 6 illustrates a more detailed schematic block diagram of an embodiment of programmable mixer 100 or 102. As shown, the $1^{st}$ mixing stage 130 includes a $1^{st}$ component 150, which may be a resistor or inductor, a pair of local oscillation transistors 152 and 154, an input transistor 156 and a current source 158. The $2^{nd}$ mixing stage 132 includes a $2^{nd}$ component 160, which may be a resistor or inductor, a pair of local oscillation transistors 162 and 164, an input transistor 166 and a current source 168.

With the compensation module 134 disabled, the $1^{st}$ and $2^{nd}$ mixing stages 130 and 132 mix a differential input signal 140A and B with the differential local oscillation 110 (LO and LO_) to produce differential output 138.

The compensation module 134 is illustrated to include a gated current source 170 coupled in parallel with current source 158 of the $1^{st}$ mixing stage 130 and a $2^{nd}$ gated source 172 coupled in parallel with current source 168 of the $2^{nd}$ mixing stage 132. Based on control signal 142, the compensation module 134 will enable gated current source 170, and/or gated current source 172. As such, when gated current source 170 is enabled, current through the input transistor 156 is increased by the ratio of current through current source 158 and current through current source 170. Similarly, the current through input transistor 166 of the $2^{nd}$ mixing stage 132 may be increased when the gated current source 172 is enabled. As such, by enabling gated current source 170 or gated current source 172, the current through the $1^{st}$ mixing stage 130 or the $2^{nd}$ mixing stage 132 may be increased to more closely match the current through the other mixing stage. For example, if the current through the input transistor 166 were determined to be greater than the current through transistor 156 of the $1^{st}$ mixing stage, the control signal 142 would enable gated current source 170 to be enabled. With gated current source 170 enabled, the current through input transistor 156 is increased thereby allowing it to more closely match the current through transistor 166. By more closely matching the currents through the $1^{st}$ mixing stage and $2^{nd}$ mixing stage, imbalances within the mixer are reduced. By reducing imbalances within the mixer, local oscillation leakage of a transmitter is reduced.

Figure 7:
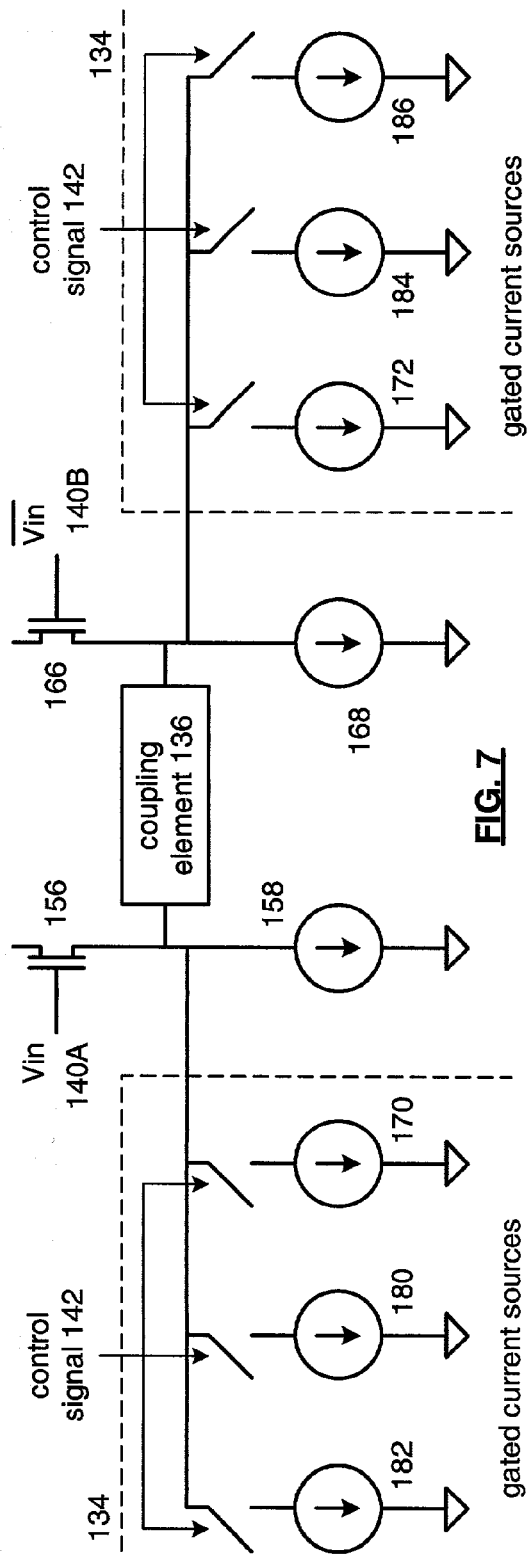
FIG. 7 illustrates a schematic block diagram of a programmable mixer including an alternate embodiment of the compensation module in accordance with the present invention.

FIG. 7 illustrates a schematic block diagram of an alternate embodiment of the compensation module 134. In this embodiment, the compensation module 134 includes a $1^{st}$ plurality of gated current sources coupled to current source 158 of the $1^{st}$ mixing stage and a $2^{nd}$ plurality of gated current sources coupled to the current source 168 of the $2^{nd}$ mixing stage. In this embodiment, any one of the gated current sources 170, 180 and 182 may be individually enabled to more finely adjust the current through input transistor 156. Similarly, any one of the plurality of gated current sources 172, 184 and 186 may be individually activated to more finely tune the current through transistor 166. As one of skill in the art will appreciate, any number of gated current sources may be added within the compensation module 134 and enabled in any combination to finely tune the current through transistor 156 and/or through transistor 166.

Figure 8:
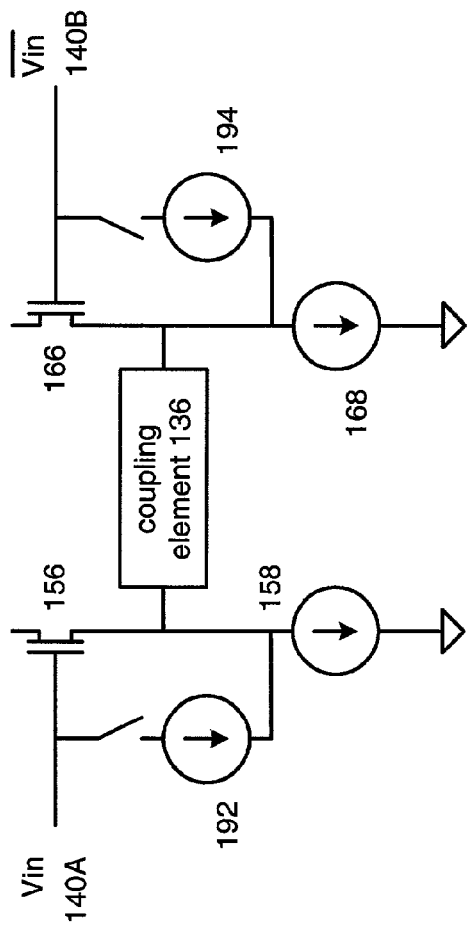
FIG. 8 illustrates a schematic block diagram of a programmable mixer having another alternate embodiment of the compensation module in accordance with the present invention.

FIG. 8 illustrates a schematic block diagram of another embodiment of the compensation module 134. In this embodiment, gated current sources 192 and 194 of the compensation module 134 are coupled to subtract current from input transistors 156 or 166.

When gated current source 192 is activated, the current through transistor 156 is reduced by the ratio of current source 192 with respect to current through current source 158. Similarly, the current through transistor 166 is reduced when the gated current source 194 is activated. As one of skill in the art will appreciate, the compensation module embodiment of FIG. 8 may be implemented in combination with the embodiments illustrated in FIGS. 6 and/or 7.

FIG. 9 illustrates a logic diagram for the processing module 64 or 76 to determine the control signal that adjusts the compensation module 134. Note that processing module 64 and 76 may be separate processing devices, a shared processing device, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 75 stores, and the processing module 64 or 75 executes, operational instructions corresponding to at least some of the steps in FIGS. 9 and 10.

As shown in FIG. 9, the processing begins at Step 200 where the processing module determines DC offset of the input signal and/or process mismatches between the $1^{st}$ mixing stage and the $2^{nd}$ mixing stage. The process then proceeds to Step 202 where the processing module determines operational characteristic mismatches between the $1^{st}$ mixing stage and the $2^{nd}$ mixing stage based on the DC offset and/or process mismatches. For example, the processing module may determine the current imbalances between the $1^{st}$ mixing stage and the $2^{nd}$ mixing stage.

The process then proceeds to Step 204 where the processing module generates a control signal to enable the compensation module to substantially compensate for the operational characteristic mismatches. For example, the control signal may indicate that one of the current sources within the compensation module is to be enabled thereby compensating for current of the respective mixing stage.

FIG. 10 illustrates a logic diagram of an alternate method for determining the control signal, which may be performed by processing module 64 and/or 76. The process begins at Step 210 where the processing module enables the $1^{st}$ and $2^{nd}$ gated current sources in a plurality of combinations. The processing then proceeds to Step 212 where the processing module determines current mismatches between the $1^{st}$ and $2^{nd}$ mixing stages for each of the plurality of combinations. The process then proceeds to Step 214 where the processing module identifies one of the plurality of combinations as providing the least current mismatch (i.e., a best match situation). The process then proceeds to Step 216 where the processing module enables the $1^{st}$ and $2^{nd}$ gated current sources based on one of the plurality of combinations.

For example, in the embodiment illustrated in FIG. 7, the processing module would sequentially enable the gated current sources in a variety of combinations and correspondingly measure the current through transistors 156 and 166. The combination of gated current sources that provide the closest match of currents through transistor 156 and 166 would be used for the programmable mixer.

Figure 11:
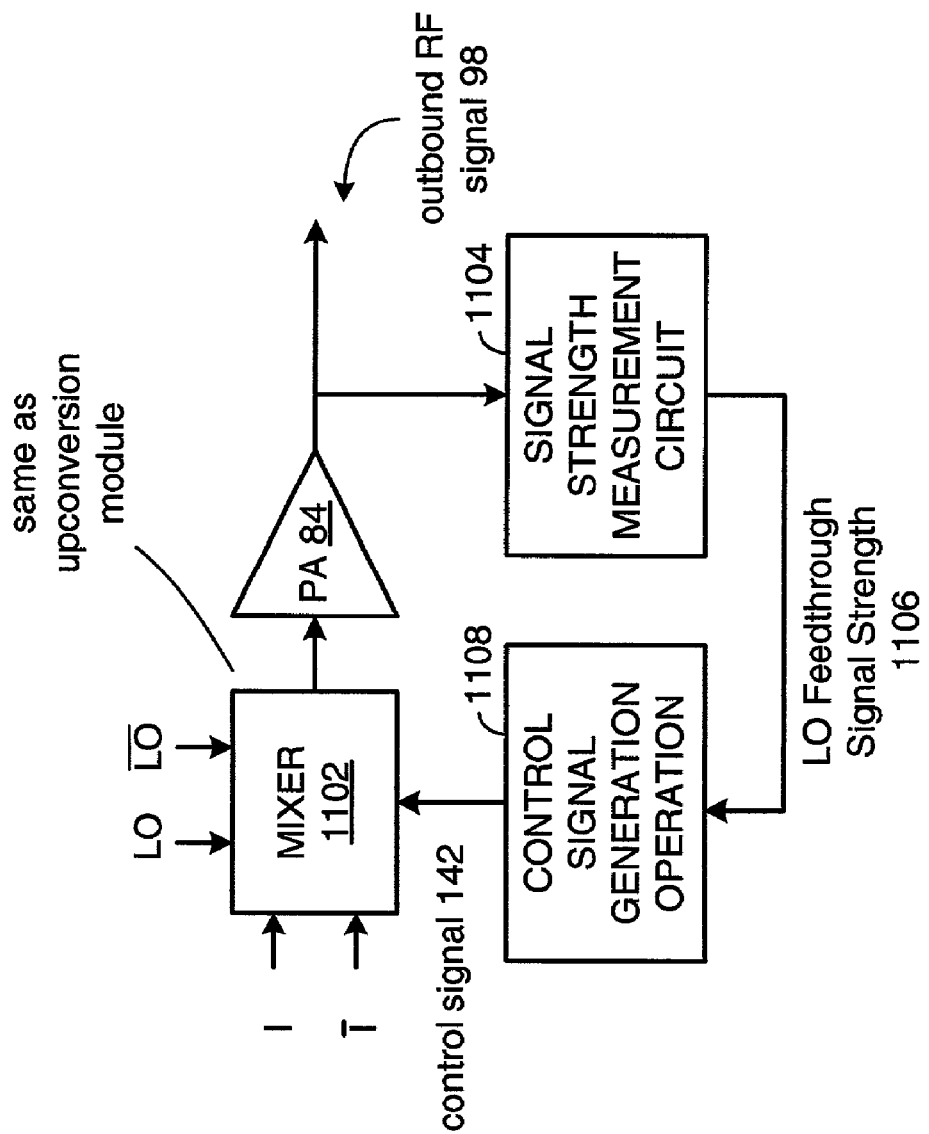
FIG. 11 is an illustration of an embodiment of calibration and control circuitry for minimizing local oscillator feedthrough.

FIG. 11 is an illustration of an embodiment of calibration and control circuitry for minimizing local oscillator feedthrough. Mixer 1102 receives input signals I and $\overline{I}$ (or Q and $\overline{Q}$) and local oscillator signals LO and $\overline{LO}$. The output of the mixer 1102 is fed to power amplifier 84 that generates an outbound RF signal 98. The output of the power amplifier 84 is also received by a signal strength measurement circuit 1104 which measures local oscillator feedthrough and generates a LO feedthrough strength signal 1106. The LO feedthrough strength signal is used by a control signal generator circuit to generate a control signal 142 that changes the operating parameters of the mixer 1102 to minimize LO feedthrough in accordance with a calibration procedure described in more detail below in FIGS. 16 and 17. In the embodiment shown in FIG. 11, the signal strength measurement circuitry 1104 and the control signal generation circuitry 1108 may be integrated into the RF unit or may reside in separate calibration and control units.

Figure 12:
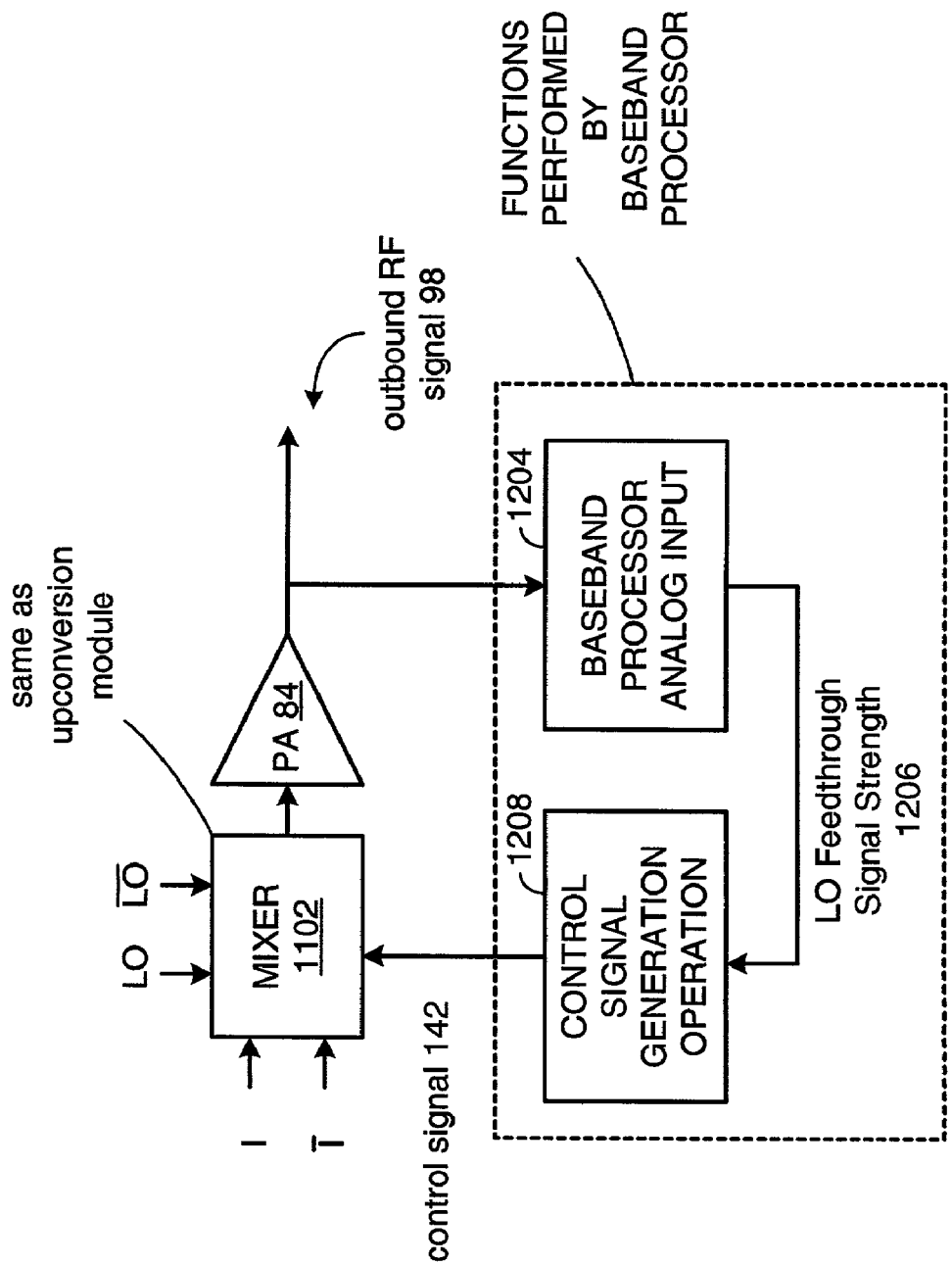
FIG. 12 is an illustration of another embodiment of calibration and control circuitry for minimizing local oscillator feedthrough wherein the LO detection and control functions are performed by the baseband processor.

FIG. 12 is an illustration of another embodiment of calibration and control circuitry for minimizing local oscillator feedthrough wherein the LO detection and control functions are performed by the baseband processor. As was discussed above, the mixer 1102 receives input signals I and $\overline{I}$ (or Q and $\overline{Q}$) and local oscillator signals LO and $\overline{LO}$. The output of the mixer 1102 is fed to power amplifier 84 that generates an outbound RF signal 98. The output of the power amplifier 84 is also provided to a baseband processor analog input 1204 which measures local oscillator feedthrough and generates a LO feedthrough strength signal 1206. The LO feedthrough strength signal 1206 is used by a control signal generator 1208 to generate an appropriate control signal 142 to change the operating parameters of mixer 1102 to minimize LO feedthrough. As illustrated in FIG. 12, the measurement of the LO feedthrough and the generation of the control signal are functions that are performed by the baseband processor circuitry.

For the embodiment shown in FIGS. 11 and 12, calibration of the mixer 1102 to minimize LO feedthrough requires that the input signals and the local oscillator signals be set to known values. During the calibration cycle, the input signals I and $\overline{I}$ (or Q and $\overline{Q}$) can be "turned off" or set to a predetermined constant value. The LO and $\overline{LO}$ signals can be maintained at their normal operation frequency or may be turned to a predetermined calibration frequency. For any of the aforementioned frequency combinations it is important that the mixer is set to a state where its output is influenced by the local oscillator and not by the other input signals.

Figure 13:
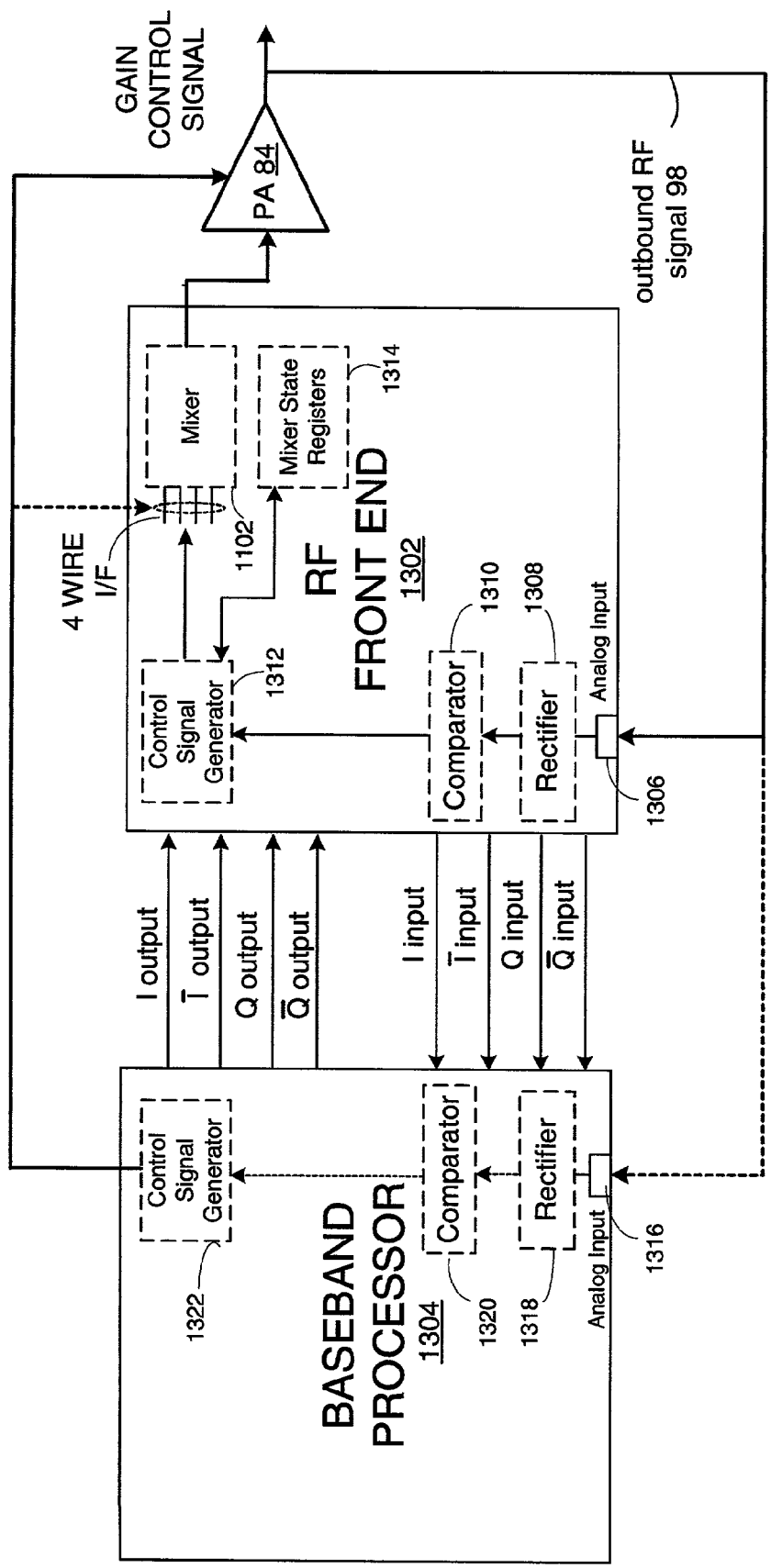
FIG. 13 is a block diagram illustration of an embodiment of a baseband processor and an RF front end having a four wire interface for controlling a mixer to minimize local oscillator feedthrough.

FIG. 13 is a block diagram illustration of alternate embodiments for controlling a mixer during a calibration cycle to minimize local oscillator feedthrough. In the first embodiment, the mixer control function resides in the RF front end 1302, while in the second embodiment, the mixer control function resides in the baseband processor 1304. In the first embodiment, the output of the power amplifier 84 is received by analog input 1306 of the RF front end 1302 and is then processed by rectifier 1308 and comparator 1310 to generate a signal with a magnitude corresponding to the local oscillator feedthrough. In the embodiment illustrated, the baseband processor 1304 produces a gain control signal that is provided to power amplifier 84. As will be described further with reference to FIG. 14, the gain of the power amplifier 84 must be greater during calibration operations in which local oscillator feedthrough is measured. Thus, the baseband processor 1304 increases the gain of the power amplifier 84 during the calibration of the mixers according to the present invention to minimize local oscillator feedthrough.

It will be appreciated by those skilled in the art that the combination of the rectifier 1308 and the comparator 1310 perform the function corresponding to the signal strength measurement circuit 1104 discussed above in connection with FIG. 11. The control signal generator 1312 receives the output of the comparator 1310 and generates an appropriate control signal to change the operational characteristics of the mixer 1102 in accordance with the processing steps discussed in greater detail below in connection with FIGS. 16 and 17. The mixer state registers 1314 store information that controls the mixer states, i.e., the operational parameters of the mixer 1102. The contents of the mixer state registers 1314 are modified by the control signal generator 1312 to select the state providing the desired mixer operational parameters.

In the second embodiment the output of the power amplifier 84 is received by the analog input 1316 of the baseband processor 1304 and is then processed by rectifier 1318 and comparator 1320 to generate a signal with a magnitude corresponding to the local oscillator feedthrough. As will be understood by those skilled in the art, the signal processing in the baseband processor can be accomplished by digital signal processing techniques using digital signal processing circuitry in the baseband processor 1304. The control signal generator 1322 receives the output of the comparator 1320 and generates an appropriate control signal to change the operational characteristics of the mixer 1102 in accordance with the processing steps discussed in greater detail below in connection with FIGS. 16 and 17. In an alternate construction of this embodiment, one of the baseband signal inputs could alternately receive the output of the power amplifier 84, e.g., I, $\overline{I}$, Q, or $\overline{Q}$. In such case, this signal path input would convert the output of the power amplifier 84 to a digital representation thereof and processing circuitry located within the baseband processor 1304 would perform the described processing steps.

As shown in FIG. 13, the operational parameters of the mixer 1102 can be controlled using a four-wire interface to set the state of mixer state register 1314. The four-wire interface allows a total of 16 states; however, only eight of those states represent unique combinations of the gated current sources used to change the operational characteristics of the mixer 1102. It will be appreciated by those skilled in the art that more interface wires will allow the control signal generator to generate signals representing a larger number of operational states of the mixer 1102.

Figure 14:
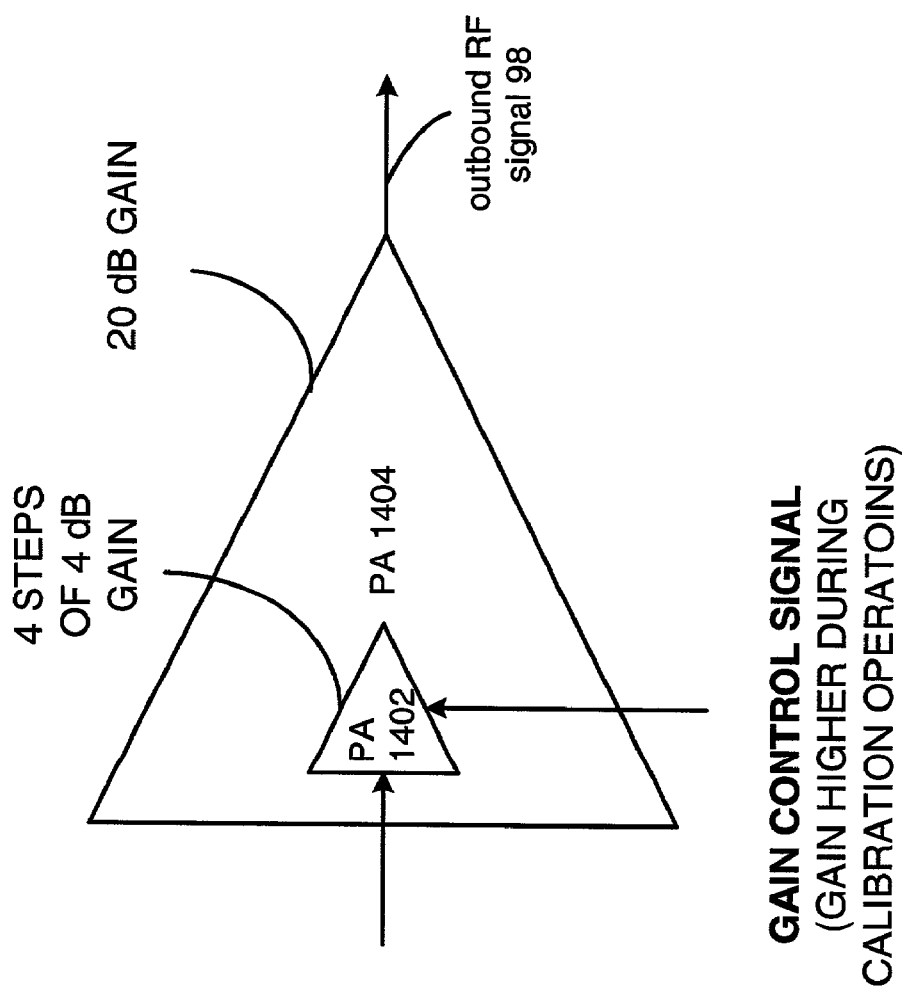
FIG. 14 is an illustration of an embodiment of a multi-stage power amplifier for generating an outbound RF signal.

FIG. 14 is an illustration of an embodiment of a multistage power amplifier 1404 for generating an outbound RF signal 98. The first amplifier stage 1402 is capable of providing 16 dB of gain with 4 steps of 4 dB. The overall gain of the multistage amplifier 1404 is 20 dB for the embodiment shown in FIG. 14. With its gain increased, the multistage amplifier 1404 is capable of detecting low signal levels of LO feedthrough during the calibration process to allow the control circuitry to generate an appropriate control signal to minimize LO feedthrough as discussed in greater detail in connection with FIGS. 16 and 17. Thus, the gain control signal, that is provided by the baseband processor in the embodiment of FIG. 13, is set such that the multistage power amplifier 1404 provides greater gain during calibration operations than during normal transmit operations.

Figure 15:
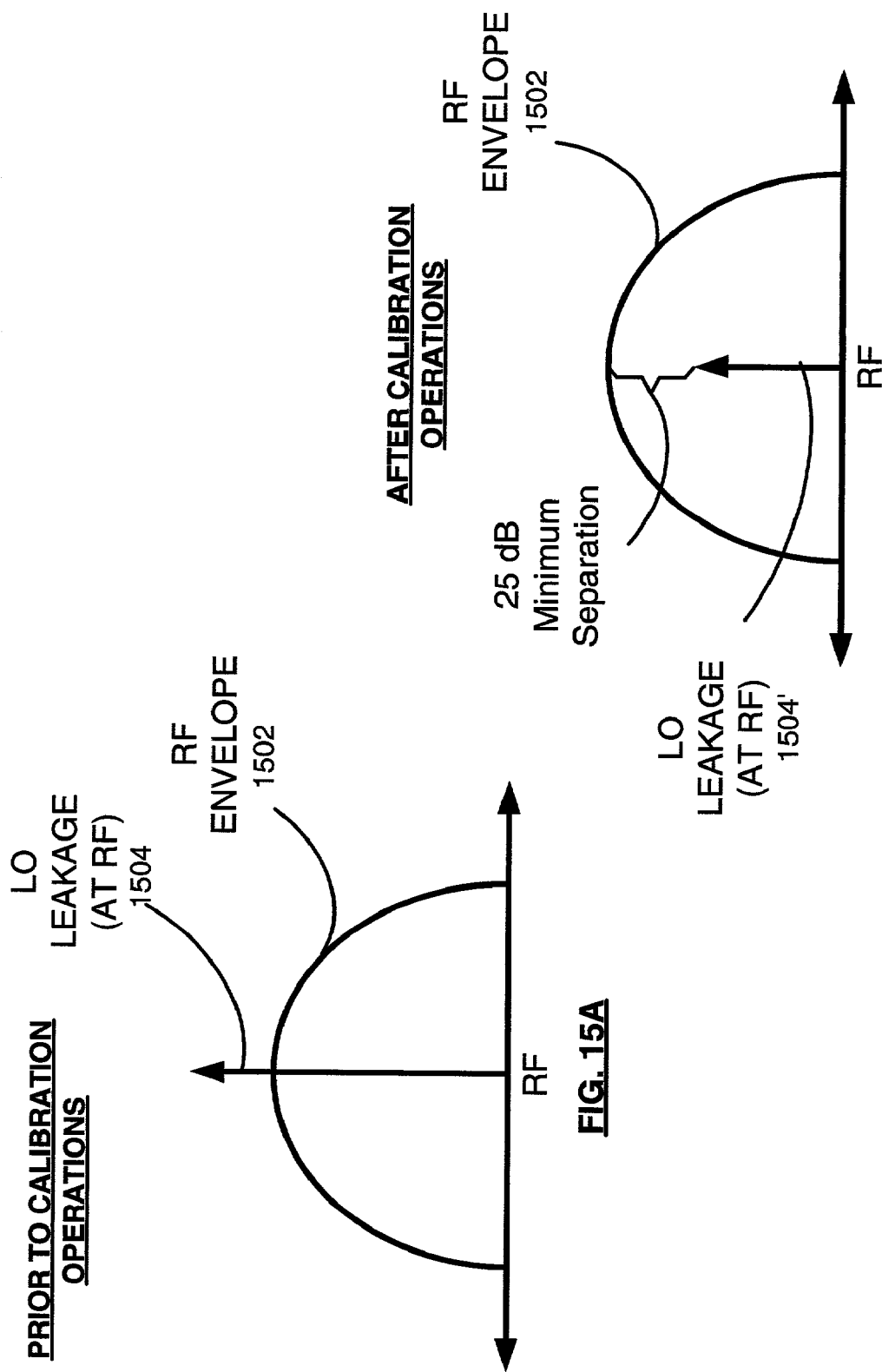
FIG. 15A is a graphical illustration of LO leakage at a RF frequency prior to calibration.
FIG. 15B illustrates the LO leakage after calibration and optimization of the mixer operating parameters.

FIG. 15A is a graphical illustration of LO leakage at a RF frequency prior to calibration. The LO leakage power density 1504 is shown to be several dB above the peak value of the RF envelope 1502. FIG. 15B illustrates the LO leakage after calibration and optimization of the mixer operating parameters. By selecting the optimal mixer values, the LO leakage can be decreased by a significant margin, e.g., 25 dB, below the peak value of the RF envelope 1502 at the RF frequency centerline to meet a specified operational requirement, e.g., an operational requirement of a standardized set of operations that govern the operation of the device.

Figure 16:
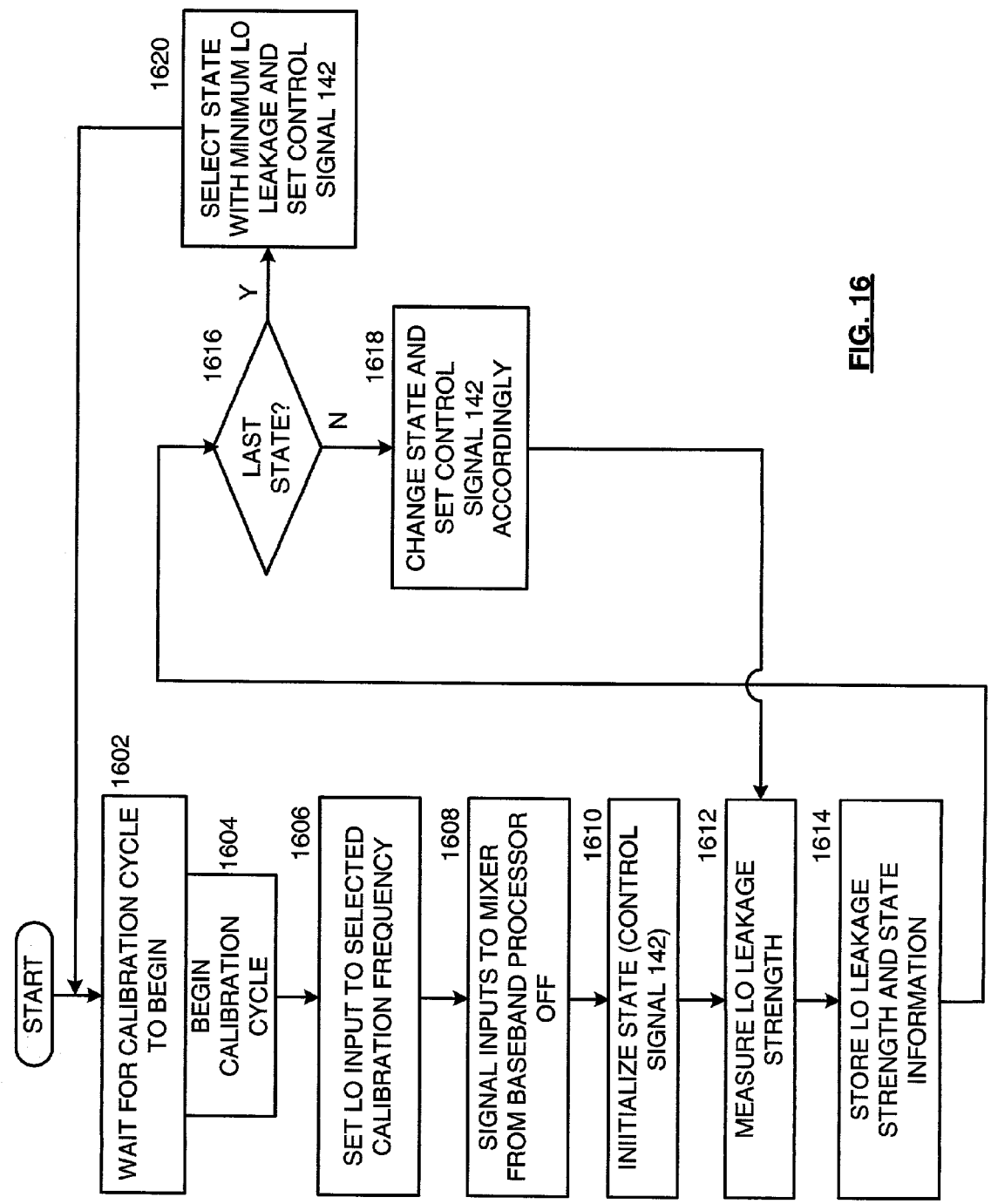
FIG. 16 illustrates a logic diagram for a method of setting a control signal to optimize operational parameters of a mixer to minimize LO feedthrough.

FIG. 16 illustrates a logic diagram for a method of setting a control signal to optimize operational parameters of a mixer to minimize LO feedthrough. In step 1602, the system is in normal operation, waiting for the calibration cycle to begin. In step 1604, the calibration cycle is initiated. In step 1606, the local oscillator input is set to a selected calibration frequency and, in step 1608 the baseband processor input signals to the mixer are turned off (or set to a constant value). In step 1610, the control signal is set to an initial state that corresponds to an initial on/off state for each of the gated current sources. For example, referring to FIG. 7, gated current sources 182 and 172 may be turned on initially, while gated sources 180, 170, 184 and 186 may be initially turned off. In step 1612, the LO leakage strength is measured and the measured value is then stored along with the corresponding control signal state information in step 1614.

In step 1616, a test is performed to determine whether the current state is the last state. If the result of the test performed in step 1616 indicates that the most recent state is the last state, processing proceeds to step 1620 where the state with the minimum LO leakage is selected and the control signal is used to set the appropriate gated current sources to optimize the performance parameters of the mixer. If the result of the test performed in step 1616 indicates that the most recent state is not the last possible state, processing proceeds to step 1618 where the state is changed and processing proceeds to steps 1612 and 1614 where LO leakage strength is measured and the corresponding measurements and the state data are stored. The processing in steps 1612 through 1618 continues until all possible states have been tested and the optimal settings for the gated current sources have been selected.

Figure 17:
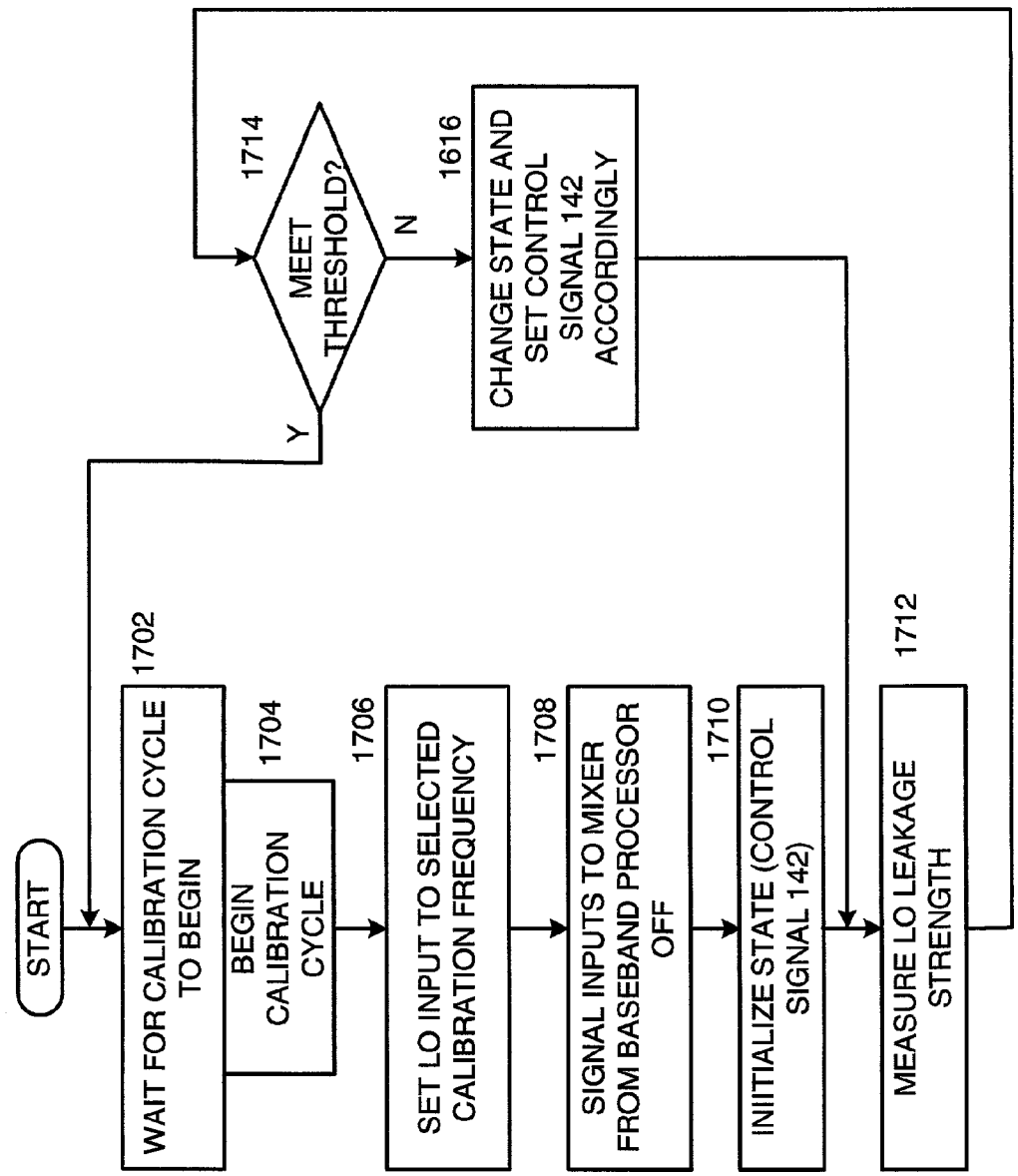
FIG. 17 illustrates a logic diagram for an alternative method of setting a control signal to optimize operational parameters of a mixer to minimize LO feedthrough.

FIG. 17 illustrates a logic diagram for an alternative method of setting a control signal to optimize operational parameters of a mixer to minimize LO feedthrough. In step 1702, the system is in normal operation, waiting for the calibration cycle to begin. In step 1704, the calibration cycle is initiated. In step 1706, the local oscillator input is set to a selected calibration frequency and, in step 1708 the baseband processor input signals to the mixer are turned off (or set to a constant value). In step 1710, the control signal is set to an initial state that corresponds to an initial on/off state for each of the gated current sources. For example, referring to FIG. 7, gated current sources 182 and 172 may be turned on initially, while gated sources 180, 170, 184 and 186 may be initially turned off.

In step 1612, the LO leakage strength is measured and stored. In step 1714, a test is performed to determine whether measured LO leakage conforms to a predetermined threshold level. If the threshold is met, the processing stops and the system returns to step 1702 to wait for the next calibration cycle. If, however, the threshold is not met, processing proceeds to step 1716 where the state is changed and the control signal 142 is set to change the mixer parameters to another state. Processing then returns to step 1712 where the LO leakage is again measured and then tested in step 1714 to determine if the predetermined threshold is met. Steps 1712–1716 are repeated until the predetermined threshold is met and the system returns to step 1702 to wait for the next calibration cycle. It will be understood by those skilled in the art that all of the processing steps in FIGS. 16 and 17 can be stored in memory and executed by an appropriate processing module, such as the transmitter module 76 or the receiver processing module 64.

The preceding discussion has presented a programmable mixer that may be used in a radio transmitter or radio transceiver. By programming the mixer to compensate for process mismatches, temperature variations, and/or DC offsets, local oscillation leakage can be reduced within transmitter sections. As one of skill in the art will appreciate, other embodiments may be derived from the teaching of the present invention, without deviating from the scope of the claims.

What is claimed is:

1. A programmable mixer, comprising:
a mixer module operable to receive differential signal inputs and differential local oscillator inputs and to generate a mixed signal output there from, the mixer having a plurality of operating states wherein each of the plurality of operating states corresponds to a magnitude of local oscillator frequency component passed by the mixer module;
a power amplifier receiving the output of the mixer and generating an outbound RF signal, the power amplifier having first and second power output levels, the second power level being a higher power output operable during a calibration cycle during which the local oscillator leakage signal is measured;
a signal strength detector operably connected to measure the local oscillator leakage signal of the outbound RF signal generated by the power amplifier; and
a compensation module operable to generate a control signal to set the operational parameters of the mixer to the operating state that minimizes the magnitude of the local oscillator leakage signal component of the signal passed by the mixer.

2. The programmable mixer according to claim 1, the second power level of the power amplifier being 20 dB higher than the first power level.

3. A wireless transmitter, comprising:
a baseband processor operable to generate a plurality of differential input signals;
an RF front end comprising a mixer module operable to receive the differential input signals and differential local oscillator inputs and to generate a mixed signal output there from, the mixer having a plurality of operating states wherein each of the plurality of operating states corresponds to a magnitude of local oscillator leakage signal component passed by the mixer module;
a power amplifier receiving the output of the mixer and generating an outbound RF signal, the power amplifier having first and second power output levels, the second power level being a higher power output operable during a calibration cycle during which the local oscillator leakage signal is measured;
a signal strength detector operably connected to measure the local oscillator leakage signal component of the signal passed by the power amplifier;
a compensation module operable to generate a control signal to set the operational parameters of the mixer to the operating state that minimizes the magnitude of the local oscillator leakage signal component of the signal passed by the mixer.

4. The transmitter according to claim 3, the second power level of the power amplifier being 20 dB higher than the first power level.

5. An RF transceiver, comprising:
an RF front end receiver section; and
an RF front end transmitter section comprising:
a mixer module operable to receive differential input signals and differential local oscillator inputs and to generate a mixed signal output there from, the mixer having a plurality of operating states wherein each of the plurality of operating states corresponds to a magnitude of local oscillator leakage signal component passed by the mixer module;
a power amplifier receiving the output of the mixer and generating an outbound RF signal, the power amplifier having first and second power output levels, the second power level being a higher power output operable during a calibration cycle during which the local oscillator leakage signal is measured;

a signal strength detector operably connected to measure the local oscillator leakage signal component of the signal passed by the power amplifier; and a compensation module operable to generate a control signal to set the operational parameters of the mixer to the operating state that minimizes the magnitude of the local oscillator leakage signal component of the signal passed by the mixer.

6. The RF transceiver according to claim 5, the second power level of the power amplifier being 20 dB higher than the first power level.